United States Patent [19]

Farwell

[11] Patent Number: 5,457,381
[45] Date of Patent: Oct. 10, 1995

[54] METHOD FOR TESTING THE ELECTRICAL PARAMETERS OF INPUTS AND OUTPUTS OF INTEGRATED CIRCUITS WITHOUT DIRECT PHYSICAL CONTACT

[75] Inventor: William D. Farwell, Thousand Oaks, Calif.

[73] Assignee: Hughes Aircraft Company, Los Angeles, Calif.

[21] Appl. No.: 955,579

[22] Filed: Oct. 2, 1992

Related U.S. Application Data

[63] Continuation-in-part of Ser. No. 768,796, Sep. 30, 1991, abandoned.

[51] Int. Cl.[6] ................................................ G01R 15/12
[52] U.S. Cl. ........................................ 324/158.1; 324/763
[58] Field of Search ............................ 324/158.1, 73.1, 324/763–537; 437/8; 371/15.1, 22.5, 22.6, 22.3, 22.1; 377/70; 364/481, 480

[56] References Cited

U.S. PATENT DOCUMENTS

| | | | |
|---|---|---|---|
| 4,357,703 | 11/1982 | Van Brunt | 371/15.1 |
| 4,782,283 | 11/1988 | Zasio | 324/763 |
| 4,837,765 | 6/1989 | Suzuki | 371/25 |
| 4,894,605 | 1/1990 | Ringleb et al. | 324/537 |
| 4,931,722 | 6/1990 | Stoica | 371/22.5 |

*Primary Examiner*—Vinh P. Nguyen
*Attorney, Agent, or Firm*—Leonard A. Alkov; W. K. Denson-Low

[57] ABSTRACT

Test circuitry implemented in an integrated circuit having a plurality of I/O circuits for testing of the electrical parameters of the I/O circuits without probing the contact pads associated therewith. The test circuitry includes a test drive bus, a test drive pad connected to the test drive bus, a test observe bus, a test observe pad connected to said test observe bus. Associated with each I/O circuit are a test drive transmission gate connected between the associated I/O pad and the test drive bus, and a test observe transmission gate connected between the associated I/O pad and the test observe bus. The transmission gates for each pad are controlled in parallel via a scan control register, and are connected by separate conductive traces to the I/O pad. If an I/O includes an input buffer, the input to the input buffer is connected to the I/O pad via the separate conductive trace to the test drive transmission gate; and if an I/O has an output driver, the output to the output driver is connected to the I/O pad via the separate conductive trace for the test observe transmission gate.

9 Claims, 2 Drawing Sheets

METHOD FOR TESTING THE ELECTRICAL PARAMETERS OF INPUTS AND OUTPUTS OF INTEGRATED CIRCUITS WITHOUT DIRECT PHYSICAL CONTACT

This is a continuation-in-part of application Ser. No. 07/768,796, filed Sep. 30, 1991 now abandoned.

BACKGROUND OF THE INVENTION

The subject invention is directed generally to test circuitry for integrated circuits, and more particularly to test circuitry that allows for electrical testing on input and/or output (I/O) circuits of integrated circuits without physically contacting each of the externally accessible I/O contact pads of the I/O circuits.

Integrated circuits include input circuits for receiving a input signals, and output circuits for delivering output signals. An input circuit is commonly implemented by an input buffer, while an output circuit is commonly implemented by an output driver. The inputs to input circuits such as input buffers are typically connected to associated contact pads, while the outputs of output circuits such as output drivers are connected to associated contact pads. An input circuit and an output circuit are sometimes combined to provide a bidirectional input/output (I/O) circuit wherein a single contact pad is connected to the input of the input circuit and to the output of the output circuit. For ease of reference, input circuits, output circuits, and bidirectional I/O circuits shall herein be called inputs, outputs, and bidirectional I/Os, respectively, and as I/O circuits or I/Os collectively. Also for ease of reference, the contact pads associated with the inputs, outputs, and bidirectional I/Os shall be called I/O contact pads, since input circuits, output circuits and bidirectional I/O circuits are connected to associated pads.

Integrated circuits are commonly tested with automatic test equipment (ATE) which typically provide respective probes for I/O contact pads of the integrated circuit being tested. Important considerations with known ATE testing include the possibility of probe damage to the I/O contact pads, complexity of test fixturing that must allow for all I/O contact pads to be directly contacted, limitations imposed on the number of I/O circuits due to the ATE capabilities as to the maximum number of I/O contact pads that can be contacted, and ATE cost which is a direct function of the number of I/O pads to be contacted.

There are a number of techniques available to test the interior logic of digital IC's without contacting all the I/O pads. These include scan techniques by which tests are loaded and evaluated serially, and Built-in Self-Test (BIST) in which the chip tests itself on command. While these techniques can fully test the interior of a chip while using just a few I/O circuits, the remaining I/O circuits are not tested for DC electrical parameters such as the voltage and current drive characteristics of the outputs circuits, the logic threshold voltages of the input circuits, the leakage current of input circuits, and the leakage current of output circuits in the high impedance state.

The testing of I/O circuit DC electrical parameters has heretofore required direct probing from ATE of the I/O circuits. The invention provides a means of testing the electrical parameters of I/O without direct probing, and when used in addition to the aforementioned techniques, allows an integrated circuit to be fully tested by contacting only a few of the many possible I/O pads.

SUMMARY OF THE INVENTION

It would therefore be an advantage to provide for test circuitry that would allow testing of the I/O circuits of integrated circuits without the need to contact or probe the I/O pads.

Another advantage would be to provide for test circuitry that would allow testing of the I/O circuits of integrated circuits without imposing limitations on the number of I/O circuits.

The foregoing and other advantages are provided by the invention in a test circuit implemented in an integrated circuit having a plurality of I/O circuits wherein an I/O circuit comprises an input circuit, an output circuit or a bidirectional input/output circuit, and wherein each I/O circuit has an associated I/O contact pad. The test circuitry includes a test drive bus, a test drive pad connected to the test drive bus, a test observe bus, a test observe pad connected to said test observe bus. Associated with each I/O circuit are (a) a test drive transmission gate having one side connected to the test drive bus and another side connected to the associated contact pad by a test drive conductive trace, and (b) a test observe transmission gate having one side connected to the test observe bus and the other side connected to the associated contact pad by a test observe conductive trace. The transmission gates for each contact pad are controlled in parallel via a scan control register. Each input buffer is connected to its associated contact pad via the associated test drive conductive trace, and each output buffer connected to its associated contact pad via the associated test observe conductive trace.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
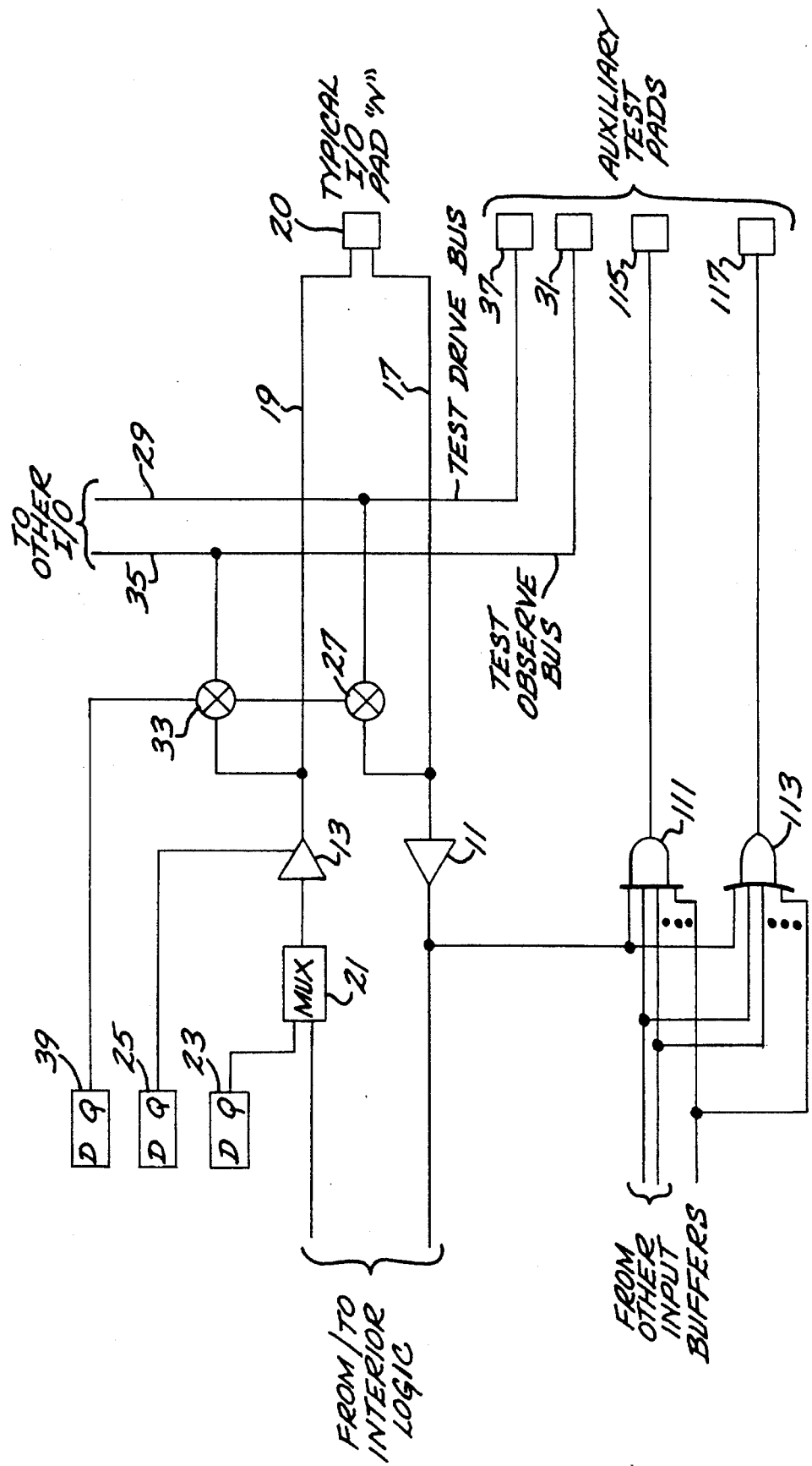
FIG. 1 is a schematic diagram of a test circuit structure in accordance with the invention as implemented with a bidirectional I/O circuit.

In the following detailed description and in the several figures of the drawing, like elements are identified with like reference numerals.

The disclosed invention is directed to test circuitry that can be incorporated into a circuit device such as an integrated circuit to allow testing of the electrical parameters of the I/O circuits of the integrated circuit without physically probing the contact pads associated therewith. As will be appreciated from the following, collectively referring to input circuits, output circuits, and bidirectional input/output as I/O circuits is appropriate since the test circuitry connected to each input, output, or bidirectional I/O is substantially the same.

In accordance with the invention, respective test control circuits are provided for the inputs, outputs, and/or bidirectional I/Os, and such test control circuits are commonly connected to test busses that are connected to test pads. Testing is accomplished by the controlling the test control circuits to select an input, output, or bidirectional I/O for testing, applying a test signal on one of the test busses, and observing the electrical parameters on the test busses.

FIG. 1 schematically depicts test circuitry in accordance with the invention as utilized with a bidirectional I/O circuit that includes an input buffer and a three-state output driver 13 that are connected to an associated I/O contact pad 20 at which input signals are received and output signals are available. The output of the input buffer 11 is connected to the interior logic of the integrated circuit, and the input to the three-state driver 13 is provided by a 2-to-1 multiplexer 21 whose inputs are provided by the interior logic of the integrated circuit and the Q output of an output drive control scan flip-flop 23. The control input to the three-state driver is provided by the Q output of a buffer control scan flip-flop 25. The output of the input buffer 11 is also connected in parallel with the outputs of other input buffers to an AND gating tree 111 and/or an OR gating tree 113 contained in the circuit in which the bidirectional I/O circuit of FIG. 1 is implemented. The output of the AND gating tree is connected to a test pad 115, and the output of the OR gating tree is connected to a test pad 117. Gating trees are commonly implemented to aid in the determination of input threshold voltages of the input buffers. Depending upon the desired test capabilities, either or both the AND gating tree and the OR gating tree can be omitted, together with the associated test pad.

One side of a test drive transmission gate 27 and the input to the input buffer 11 are connected to the associated I/O pad 20 by a test drive conductive trace 17. The other side of the test drive transmission gate is connected to a test drive bus 29. One side of a test observe transmission gate 33 and the output of the three-state output driver 13 are connected to the associated I/O pad 20 by a test observe conductive trace 19. The other side of the test observe transmission gate 33 is connected to a test observe bus 35. The test drive conductive traces of other inputs, outputs, and/or bidirectional I/Os of the circuit device containing the bidirectional circuit of FIG. 1 are also coupled to the test drive bus via respective test drive transmission gates; and the test observe conductive traces of other inputs, outputs, and/or bidirectional I/Os are also coupled to the test observe bus via respective test observe transmission gates. Examples of a dedicated output circuit and a dedicated input circuit that implement test circuitry in accordance with the invention are described further herein.

The test drive transmission gate 27 and the test observe transmission gate 33 are controlled in parallel by the Q output of a transmission gate control scan flip-flop 39 in a double-pole-single-throw configuration, whereby both transmission gates 27, 33 are on or off together.

The test drive bus 29 is connected to an externally accessible test drive pad 37; and the test observe bus 35 is connected to an externally accessible test observe pad 31.

Figure 2:
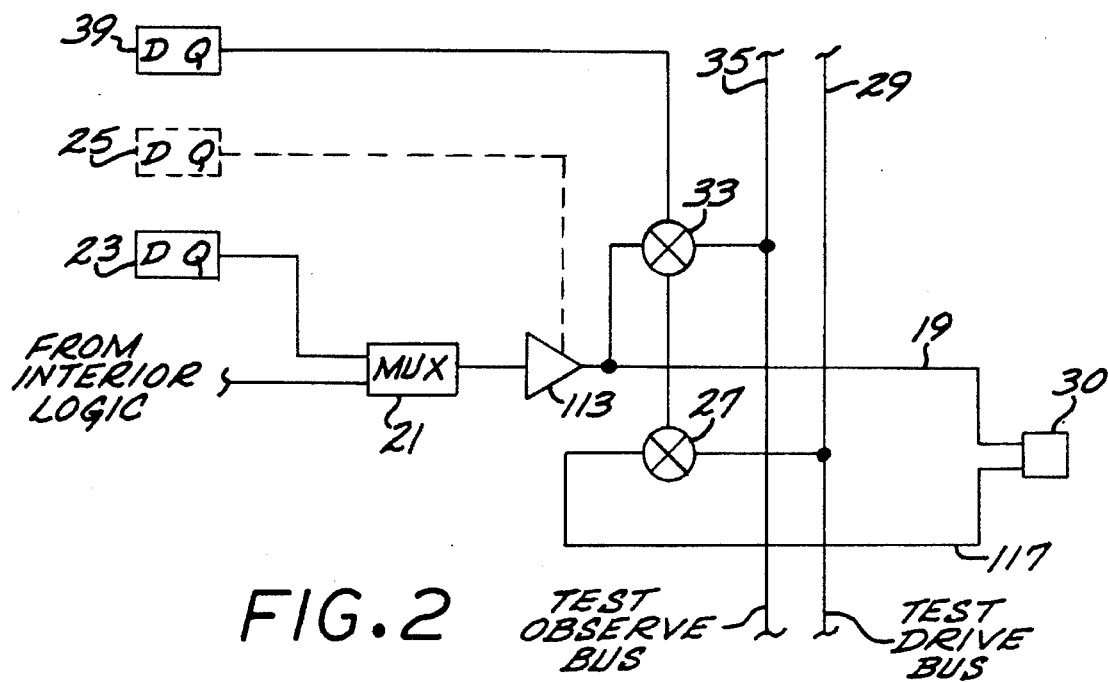
FIG. 2 is a schematic diagram of a test circuit structure in accordance with the invention as implemented with a an output circuit.

Referring now to FIG. 2, schematically depicted therein is test circuitry in accordance with the invention as utilized with a dedicated output circuit that includes an output driver 113 which can be a three-state driver, as indicated by the dashed control line connected thereto. The input to the output driver 113 is provided by a 2-to-1 multiplexer 21 whose inputs are provided by the interior logic of the integrated circuit in which the output circuit of FIG. 2 is implemented, and the Q output of an output drive control scan flip-flop 23. If the output driver 113 is a three-state driver, the control input thereto is provided by the Q output of a buffer control scan flip-flop 25. The output of the output driver 113 is connected to an associated I/O pad 30 by a test observe conductive trace 19 which is coupled to the test observe bus 35 via a test observe transmission gate 33. A test drive trace 117 is connected between the associated I/O pad 30 and one side of a test drive transmission gate 27 whose other side is connected to the test drive bus 29. The test drive conductive traces of other inputs, outputs, and/or bidirectional I/Os of the circuit device containing the dedicated output circuit of FIG. 2 are also coupled to the test drive bus via respective test drive transmission gates; and the test observe conductive traces of other inputs, outputs, and/or bidirectional I/Os are also coupled to the test observe bus via respective test observe transmission gates. The test drive transmission gate 27 and the test observe transmission gate 33 are controlled in parallel by the Q output of a transmission gate control scan flip-flop 39 in a double-pole-single-throw configuration, whereby both transmission gates 27, 33 are on or off together.

Figure 3:
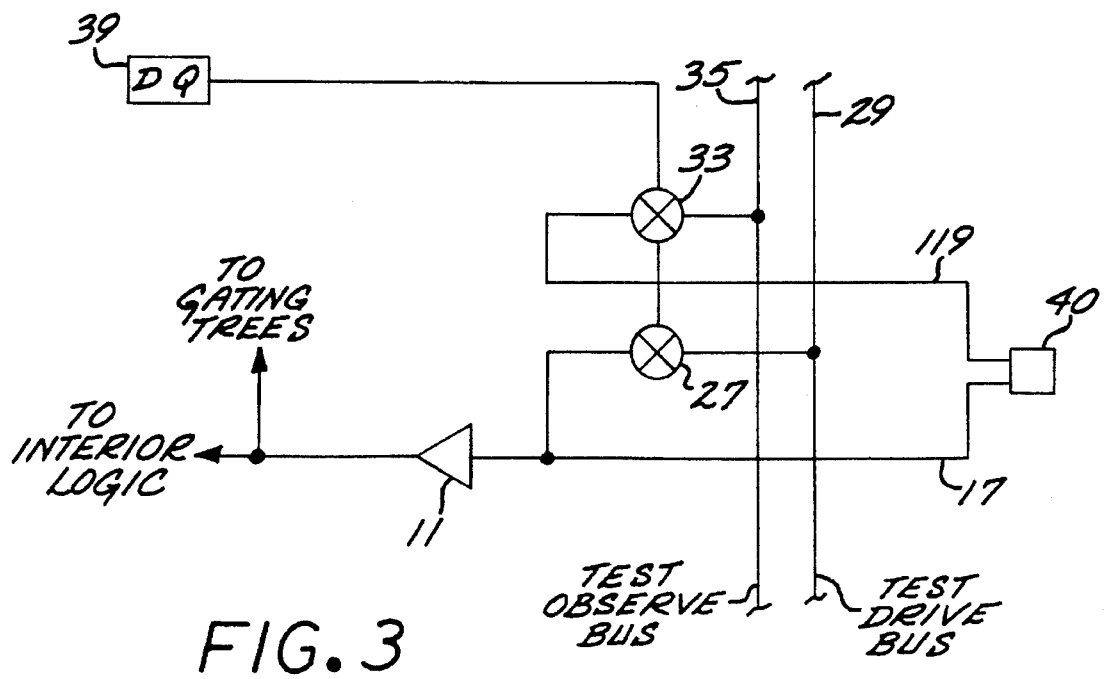
FIG. 3 is a schematic diagram of a test circuit structure in accordance with the invention as implemented with an input circuit.

Referring now to FIG. 3, schematically depicted therein is test circuitry in accordance with the invention as utilized with a dedicated input circuit that includes an input buffer 11 those output is connected to the interior logic of the integrated circuit, and optionally as an input to gating trees contained in the circuit in which the dedicated input circuit of FIG. 3 is implemented, where such gating trees are similar to the gating trees shown in FIG. 1. The input of the input buffer 11 is connected to an associated I/O pad 40 by a test observe conductive trace 17 which is coupled to the test drive bus 29 via a test drive transmission gate 27. A test observe trace 119 is connected between the associated I/O pad 40 and one side of a test observe transmission gate 33 whose other side is connected to the test observe bus 35. The test observe conductive traces of other inputs, outputs, and/or bidirectional I/Os of the circuit device containing the dedicated input circuit of FIG. 3 are also coupled to the test drive bus via respective test drive transmission gates; and the test observe conductive traces of other inputs, outputs, and/or bidirectional I/Os containing the output circuit of FIG. 3 are also coupled to the test observe bus via respective test observe transmission gates. The test drive transmission gate 27 and the test observe transmission gate 33 are controlled in parallel by the Q output of a transmission gate control scan flip-flop 39 in a double-pole-single-throw configuration, whereby both transmission gates 27, 33 are on or off together.

It is noted that in accordance with the invention, for each input circuit, output circuit, or bidirectional I/O circuit, separate conductive traces are provided for the respective connections between the associated I/O pad and the associated test drive transmission gate 27 and the test observe transmission gate 33. If a particular I/O includes an input buffer, such input buffer is connected to the I/O pad by the test drive conductive trace that connects the I/O pad to the test drive transmission gate. If a particular I/O includes an output driver, such output driver is connected to the I/O pad by the test observe conductive trace that connects the I/O pad to the test observe transmission gate. As discussed more fully herein, the separate test drive and test observe conductive traces for each I/O allows continuity to the I/O pad to be checked without probing the I/O pad.

In accordance with conventional boundary scan techniques, the output drive control flip-flops 23 for bidirectional I/Os and dedicated outputs, the buffer control scan flip-flops 25 for bidirectional I/Os and dedicated outputs with three-state, and the transmission gate control flip-flops 39 for all I/Os can be connected in a single scan register chain. Alternatively, they can be connected in multiple chains corresponding to the test functions of output drive control, three-state buffer control, and transmission gate control.

The test circuit in accordance with the invention generally calls for addition of the following elements to each I/O circuit: four conductor traces (input, output, test drive, and test observe); two transmission gates 27, 33; and a transmission gate control scan flip-flop 39. Further, the test drive bus 29, the test observe bus 35, the test drive pad 37, and the test observe pad 31 are also added to the integrated circuit, together with an AND gating tree and/or an OR gating tree if not already provided in the integrated circuit.

The following sets forth illustrative examples of test procedures that can be performed with the disclosed test circuitry with automatic test equipment (ATE).

OUTPUT TESTING

Output Drive Testing For Bidirectional I/Os And Dedicated Outputs

Testing the "1" state on the Nth driver
1. Set the Nth driver to provide a 1 output via scan control.
2. Turn on transmission gates for the Nth driver via scan control, and turn off transmission gates for other output drivers via scan control.
3. Set test drive bus to a voltage that is less than the output driver output voltage (e.g., 0 volts) via the ATE.
4. Simultaneously measure current on the test drive bus via the ATE, and measure voltage on the test observe bus via the ATE.
5. The resulting current and voltage measurement defines a point on the output driver voltage/current characteristic. If the voltage/current measurement falls within the minimum and maximum expected voltage/current characteristics, the driver has passed the test.
6. Repeat the foregoing for each I/O that has an output function.

Testing the "0" state on the Nth driver
This test is conducted similarly to the test for the "1" state, except that the Nth driver is set to drive a "0", the test drive voltage is set to a positive voltage (e.g., the voltage corresponding to the "1" state), and different maximum and minimum expected voltage/current characteristics are utilized.

INPUT TESTING

Input Threshold Testing For Inputs Of A Device Having Only Bidirectional I/Os
1. A gating tree is required which gates together all inputs for observation. The gating tree may be either an AND function or an OR function.
2. Disable output driver associated with the Nth I/O via scan control.
3. Set output drivers of remaining I/Os to state which will configure the gating tree to change state when the output of the Nth input buffer changes state (e.g., all 1's for an AND gating tree, or all 0's for an OR gating tree).
4. Turn on transmission gates of the Nth I/O.
5. Provide up and down ramping voltage on the test drive bus via the ATE.
6. On the test observe pad, measure the voltages at which the input buffer transitions as indicated by the changes of state at the gating test pad.
7. Repeat for each I/O that has an input function.

Alternative Input Threshold Testing For Inputs Of A Device Having Dedicated Inputs
1. Two gating trees providing respective AND and OR functions, or equivalents, are required for gating together all inputs for observation.
2. Disable output drivers of any bidirectional I/Os via scan control.
3. Turn on all transmission gates for all I/Os that have input functions.
4. Provide up and down ramping voltage on the test drive bus via the ATE.
5. Monitor the voltage on the test observe pad.
6. If the output of the AND gating tree changes is logical 1 when the up ramping test voltage is at a predetermined minimum threshold for logical 1 (this is the minimum specified voltage by which all inputs should transition to logical 1), then all inputs are within specification for the 0 to 1 transition.
7. If the output of the OR gating tree is a logical 0 when the down ramping test voltage is at a predetermined maximum threshold for logical 0 (this is the maximum specified voltage by which all inputs should transition to 0), then all inputs are within specification for the 1 to 0 transition.

LEAKAGE TESTS FOR INPUTS, 3-STATE OUTPUTS AND BIDIRECTIONAL I/OS

1. If the Nth I/O to be tested is a dedicated three state output or a bidirectional I/O, disable the output driver via scan control.
2. Set all remaining output drivers, including dedicated output drivers, to drive 0s.
3. Turn on the transmission gates of the Nth I/O.
4. Drive the logical 0 voltage on the test bus via the ATE and observe via the ATE the logical 0 level leakage current from the Nth I/O. (Since all other outputs are at the voltage for logical 0, spurious leakage across the closed transmission gates is avoided.)
5. Set remaining output drivers, including dedicated output drivers, to drive 1s.
6. Drive the logical 1 voltage on the test bus via the ATE, and observe via the ATE the logical 1 leakage current from the Nth I/O. (Since all other outputs are at the voltage for logical 1, spurious leakage across the closed transmission gates is avoided.)

I/O PAD CONTINUITY

The continuity of the respective traces between I/O pads and respective input and output buffers will have been verified upon successful completion of the foregoing tests.

For inputs during threshold testing, the test observe pad must be at the voltage driven on the test drive pad. An open on either an input trace or an output trace will result in an erroneous result.

For outputs during drive testing, an open on either an input trace or an output trace will cause zero current on the test drive pad, which is also an erroneous result.

The foregoing has been a disclosure of an integrated circuit test structure that advantageously allows for automatic testing by probing only a few signal pads on the integrated circuit, testing at higher assembly levels, and in-system testing. As a result of enabling automatic testing by probing only a few signal pads, probe damage to I/O pads is eliminated, test fixturing is simpler and less expensive, automatic test equipment limitations as to I/O count are avoided, and automatic test equipment cost can be reduced.

Although the foregoing has been a description and illustration of specific embodiments of the invention, various modifications and changes thereto can be made by persons skilled in the art without departing from the scope and spirit of the invention as defined by the following claims.

What is claimed is:

1. In a circuit having a plurality of I/O circuits wherein each input/output (I/O) circuit comprises an input circuit having an input buffer, an output circuit having an output driver, each I/O circuit having an associated pad, test circuitry comprising:

a test observe bus;

a test observe pad connected to said test observe bus;

a test drive bus;

a test drive pad connected to said test drive bus;

first selection means associated with each I/O circuit for controllably conductively connecting the associated I/O pad to said test observe bus;

a test drive conductive trace connected between said first selection means and the associated I/O pad, said test drive conductive trace being further connected an input buffer if the I/O circuit includes an input buffer;

second selection means associated with each I/O circuit for controllably conductively connecting the associated I/O pad to said test drive bus;

a test observe conductive trace connected between said first selection means and the associated I/O pad, test observe conductive trace being further to an output driver if the I/O circuit includes an output driver;

whereby the I/O pad of a selected I/O circuit can be conductively connected to said test drive bus and to said test observe bus, such that electrical parameters of the I/O circuits can be tested without physically probing the associated I/O pads.

2. The test circuitry of claim 1 wherein said first selection means comprises a test drive transmission gate conductively connected between said test drive conductive trace and said test drive bus, and wherein said second selection means comprises an observe transmission gate connected between said test observe conductive trace and said test observe bus.

3. The test circuitry of claim 2 wherein the test drive transmission gate and the observe transmission gate for an I/O are controlled in parallel via a scan register.

4. In a integrated circuit having a plurality of bidirectional input/outputs (I/O) circuits each having an input buffer, and an associated I/O contact pad, test circuitry comprising:

a respective test observe conductive trace for each bidirectional I/O circuit for connecting the output of the three-state driver to the associated I/O pad;

a respective test drive conductive trace for each bidirectional I/O for connecting the input of the input buffer to the associated I/O pad;

a test observe bus;

a test observe pad connected to said test observe bus;

a test drive bus;

a test drive pad connected to said test observe bus; and first selection means for each bidirectional I/O circuit for controllably conductively connecting said test observe conductive trace to said test observe bus; and second selection means for each bidirectional I/O circuit for controllably conductively connecting said test drive conductive trace to said test drive bus;

whereby the I/O pad of a selected bidirectional I/O circuit can be conductively connected to said test drive bus and to said test observe bus, such that electrical parameters of the I/Os can be tested without physically probing the I/O pads.

5. The test circuitry of claim 4 wherein said wherein said first selection means comprises a test drive transmission gate conductively connected between the associated bidirectional I/O pad and said test drive bus; and wherein said second selection means comprises an observe transmission gate conductively connected between the associated bidirectional I/O pad and said test observe bus.

6. The test circuitry of the claim 5 wherein the test drive transmission gate and the observe transmission gate for a bidirectional I/O circuit are controlled in parallel via test control logic.

7. The test circuitry of claim 6 wherein said test control logic includes a scan register.

8. In an integrated circuit having a plurality of input circuits each having an input buffer and an associated I/O contact pad, test circuitry comprising:

a respective test observe conductive trace for each input circuit having one end connected to the associated I/O pad;

a respective test drive conductive trace for each input circuit for connecting the input of the input buffer to the associated I/O pad;

a test observe bus;

a test observe pad connected to said test observe bus;

a test drive bus;

a test drive pad connected to said test observe bus; and a test observe transmission gate for each input circuit for controllably conductively connecting said test observe conductive trace to said test observe bus; and a test drive transmission gate for each input circuit for controllably conductively connecting said test drive conductive trace to said test drive bus;

whereby the I/O pad of a selected input circuit can be conductively connected to said test drive bus and to said test observe bus, such that electrical parameters of the input circuits can be tested without physically probing the I/O pads.

9. In an integrated circuit having a plurality of output circuits each having an output driver and an associated I/O contact pad, test circuitry comprising:

a respective test observe conductive trace for each output circuit for connecting the output of the output driver to the associated I/O pad;

a respective test drive conductive trace for each input circuit having one end connected to the associated I/O pad;

a test observe bus;

a test observe pad connected to said test observe bus;

a test drive bus;

a test drive pad connected to said test observe bus; and a test observe transmission gate for each input circuit for controllably conductively connecting said test observe conductive trace to said test observe bus; and a test drive transmission date for each input circuit for controllably conductively connecting said test drive conductive trace to said test drive bus;

whereby the I/O pad of a selected output circuit can be conductively connected to said test drive bus and to said test observe bus, such that electrical parameters of the output circuits can be tested without physically probing the I/O pads.

* * * * *